(12) United States Patent
Mattmann

(10) Patent No.: US 8,646,329 B2  
(45) Date of Patent: Feb. 11, 2014

(54) TANK SENSOR CIRCUIT BOARD FOR A FILL LEVEL SENSOR IN A VEHICLE TANK

(75) Inventor: Erich Mattmann, Heidesheim (DE)

(73) Assignee: Continental Automotive GmbH, Hannover (DE)

( * ) Notice: Subject to any disclaimer, the term of this patent is extended or adjusted under 35 U.S.C. 154(b) by 772 days.

(21) Appl. No.: 12/747,069

(22) PCT Filed: Dec. 4, 2008

(86) PCT No.: PCT/EP2008/066784  
§ 371 (c)(1),  
(2), (4) Date: Jun. 9, 2010

(87) PCT Pub. No.: WO2009/077342  
PCT Pub. Date: Jun. 25, 2009

(65) Prior Publication Data  
US 2010/0263443 A1   Oct. 21, 2010

(30) Foreign Application Priority Data  
Dec. 19, 2007 (DE) .................. 10 2007 061 316

(51) Int. Cl.  
*G01F 23/00* (2006.01)

(52) U.S. Cl.  
USPC .......................................... 73/290 R; 73/317

(58) Field of Classification Search  
USPC ............................................................ 73/317  
See application file for complete search history.

(56) References Cited

U.S. PATENT DOCUMENTS

| | | | |
|---|---|---|---|
| 5,798,640 A | 8/1998 | Gier et al. | |
| 6,401,533 B1 | 6/2002 | Gier et al. | |
| 6,518,873 B1 * | 2/2003 | O'Regan et al. | 338/190 |
| 6,862,919 B2 * | 3/2005 | Lin et al. | 73/53.01 |
| 7,002,447 B2 * | 2/2006 | Dedert et al. | 338/190 |
| 7,091,819 B1 | 8/2006 | Forgue | |
| 2004/0196137 A1 | 10/2004 | Dedert et al. | |
| 2005/0035843 A1 | 2/2005 | Dedert et al. | |
| 2005/0040929 A1 | 2/2005 | Dedert et al. | |
| 2005/0040930 A1 | 2/2005 | Dedert et al. | |

FOREIGN PATENT DOCUMENTS

| | | |
|---|---|---|
| DE | 24 12 902 | 9/1975 |
| DE | 19 526 254 | 1/1997 |
| DE | 197 01 246 | 7/1998 |
| DE | 10 2006 028 539 | 1/2007 |

* cited by examiner

*Primary Examiner* — Hezron E Williams  
*Assistant Examiner* — Mark A Shabman  
(74) *Attorney, Agent, or Firm* — Cozen O'Connor

(57) ABSTRACT

A tank sensor circuit board for a fill level sensor in a vehicle tank, including a support element, on which contact surfaces containing silver are applied using thick layer technology. The contact surfaces are made up of a silver layer and a top layer containing nickel, palladium and gold, completely or partly covering the silver layer.

23 Claims, 3 Drawing Sheets

TANK SENSOR CIRCUIT BOARD FOR A FILL LEVEL SENSOR IN A VEHICLE TANK

PRIORITY CLAIM

This is a U.S. national stage of Application No. PCT/EP2008/066784, filed on Dec. 4, 2008, which claims priority to the German Application No.: 10 2007 061 316.6, filed: Dec. 19, 2007, the contents of both are incorporated herein by reference.

BACKGROUND OF THE INVENTION

1. Field of the Invention

The invention relates to a tank sensor circuit board for a fill level sensor in a vehicle tank, having a carrier element to which contact faces containing silver are applied using thick film technology.

2. Related Art

In tank sensor circuit boards, it is known to manufacture the contact faces from silver-palladium or else also from silver-palladium-gold. These substances are intended to ensure that the contact faces are resistant to fuel and abrasion.

These contact faces, which are applied with a layer thickness of approximately 15 μm using thick film technology, are very expensive owing to the noble metals gold and palladium.

SUMMARY OF THE INVENTION

An object of the invention is to provide a tank sensor circuit board of the type mentioned at the beginning whose contact faces are both cost-effective and resistant to fuel and abrasion.

According to one embodiment of the invention the contact faces comprise a silver layer which is applied to a first surface of the carrier element or a silver-containing layer, and a top layer which entirely or partially covers the silver layer or the silver-containing layer that contains nickel, palladium and gold.

The silver layer or silver-containing layer ensures good conductive properties, but it is not resistant to fuel or abrasion.

Since resistance to fuel and abrasion is necessary only at the free surface of the contact faces, it is sufficient to provide the silver layer or silver-containing layer with the top layer which has these properties.

Palladium, which diffuses into the gold, ensures that there is a solid and therefore wear-resistant structure of the top layer, while the nickel brings about good soldering properties of the contact faces.

This leads to a cost advantage of the order of magnitude of about 50%.

The top layer can be composed of separate layers of nickel, palladium and gold, wherein the silver layer or the silver-containing layer is covered preferably by a first palladium layer, the first palladium layer is covered by a nickel layer, and the nickel layer is covered by a gold layer.

The gold as the top layer ensures good contact with a contact element which can be placed on the contact faces.

To increase the wear resistance of the gold layer, the nickel layer can be covered by a second palladium layer which supports the gold layer.

Since the thickness of the silver layer or the silver containing layer can be a multiple of the thickness of the top layer, the small thickness of the top layer requires only a small amount of its expensive material.

The thickness of the silver layer or silver-containing layer can be about 20 to 40 times the thickness of the top layer, wherein the thickness is preferably 25 to 35 times, in particular 30 times, the thickness of the top layer.

The silver layer or silver-containing layer can have a thickness of 10 μm to 200 μm, in particular of 15 μm, the first palladium layer can have a thickness of 0.001 μm to 0.02 μm, in particular of 0.01 μm, the nickel layer can have a thickness of 3 μm to 7 μm, in particular of 5 μm, the second palladium layer can have a thickness of 0.1 μm to 0.7 μm, in particular of 0.5 μm, and the gold layer can have a thickness of 0.05 μm to 0.14 μm, in particular of 0.12 μm.

For the sake of resistance to fuel, the carrier element is preferably ceramic.

To utilize the existing faces and therefore to reduce the necessary installation space, second contact faces can be applied to the second surface of the carrier element, wherein first and second contact faces can be connected to one another in an electrically conductive fashion.

In a simple embodiment, the first and second contact faces can be connected to one another in an electrically conductive fashion by vias in the carrier element, which vias are composed of through-openings which project out of the carrier element, are closed off in a gastight fashion and are metallized on their walls or completely filled with a metal filling.

The manufacturing process is simplified when the metallization or the metal filling is composed of the same material as the contact faces.

To keep the regions of the contact faces that are not to be coated free of the top layer when the top layer is applied, the areas of the silver layer or silver-containing layer which are not covered by the top layer can be covered by a protective layer.

In this context, the protective layer is simply a glass layer. In order to produce a resistance network, one or more resistance layers can be applied to the carrier element adjacent to the contact faces using thick film technology, which resistance layers can be covered by the protective layer in order to keep them free when the top layer is applied.

Contact can be made with the contact faces by a slide element, which can be pivoted as a function of the filling level of the vehicle tank that can move while resting on the top layers forming a slider path of the contact faces so that a potentiometer is formed.

In another embodiment, one of several contact elements which form a contact track can be deflectable as a function of the fill level of the vehicle tank in order to bear on top layers of the contact faces.

If the slide element or the contact elements here are composed at least partially of gold, this leads to good and secure contact formation.

BRIEF DESCRIPTION OF DRAWINGS

Exemplary embodiments of the invention are illustrated in the drawing and described in more detail below. In said drawing.

DETAILED DESCRIPTION OF THE DRAWINGS

Figure 1:
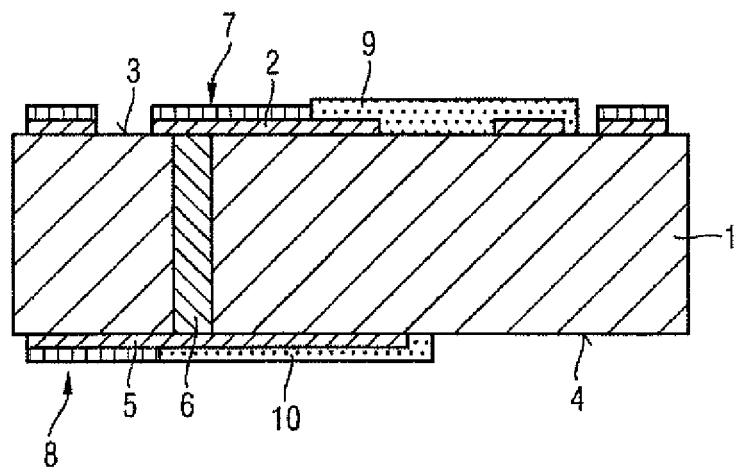
FIG. 1 is a cross section through a tank sensor circuit board.
Figure 2:
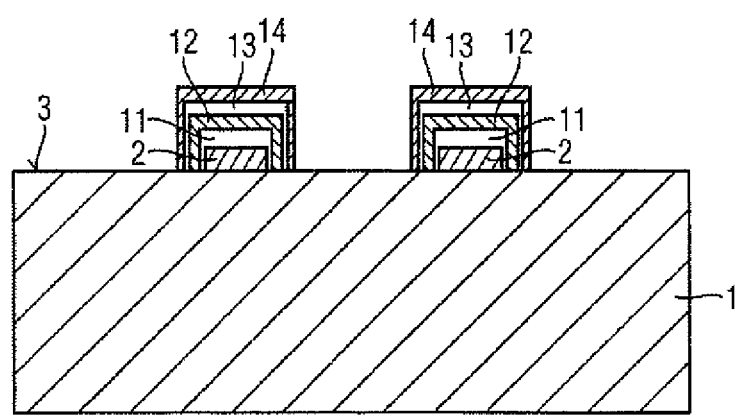
FIG. 2 is an enlarged basic illustration of two contact faces, applied to a carrier element, of the tank sensor circuit board according to FIG. 1.

The tank sensor circuit board illustrated in FIGS. 1 and 2 has a substrate or plate like carrier element 1 made of ceramic, to whose first surface 3 a contact face 18 is applied, which has a first silver layer 2 with a thickness of 15 μm.

Figure 3:
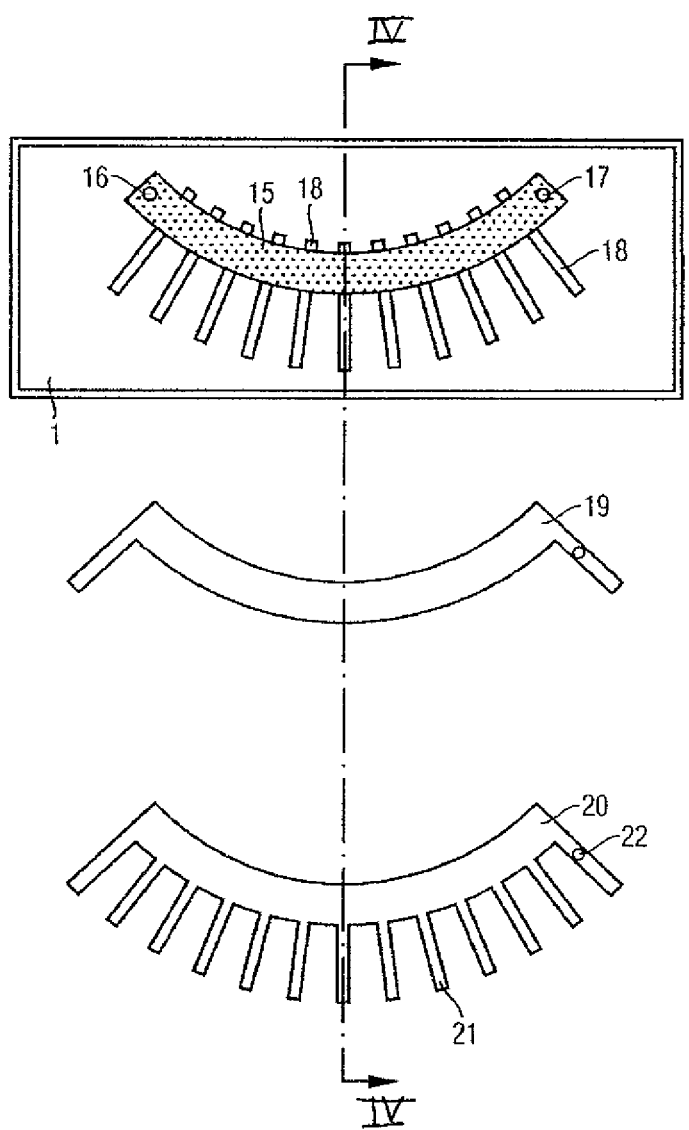
FIG. 3 an exploded illustration of a tank sensor.

In a region of the silver layer 2 which is kept free, a resistance layer 15 is applied to the first surface 3 of the carrier element 1 shown in FIG. 3.

In FIG. 1, a second silver layer 5 with the same thickness is applied approximately opposite to the first silver layer 2 on a second surface 4 of the carrier element 1 which is parallel to the first surface 3.

In the carrier element 1, a through-opening 6 whose walls are metallized with silver is arranged between the first and second silver layers 2 and 5, so that a via is formed between the first and second silver layer 2 and 5.

The ends of the through-opening 6 were closed off in a gastight fashion by the first and second silver layer 2 and 5.

After the silver layers 2 and 5 were applied to the carrier element 1, the regions which were not covered by top layers 7 and 8 which are applied later to the silver layers 2 and 5, and the resistance layer 15, are covered by glass layers 9 and 10 by applying and fusing glass frits.

These glass layers 9 and 10 ensure that the areas which are not covered remain free of cover layers 7 and 8 when the top layers 7 and 8 are applied to the silver layers 2 and 5.

As is apparent from FIG. 2, the top layers 7 and 8 are composed of first palladium layers 11 which are firstly applied to the silver layers 2 and 5 and have a thickness of 0.01 μm.

Nickel layers 12 with a thickness of 5 μm are applied thereto, and in turn second palladium layers 13 with a thickness of 0.5 μm are applied to the latter, and finally gold layers 14 with a thickness of 0.12 μm are applied to the second palladium layers 13 using thick film technology.

Figure 4:
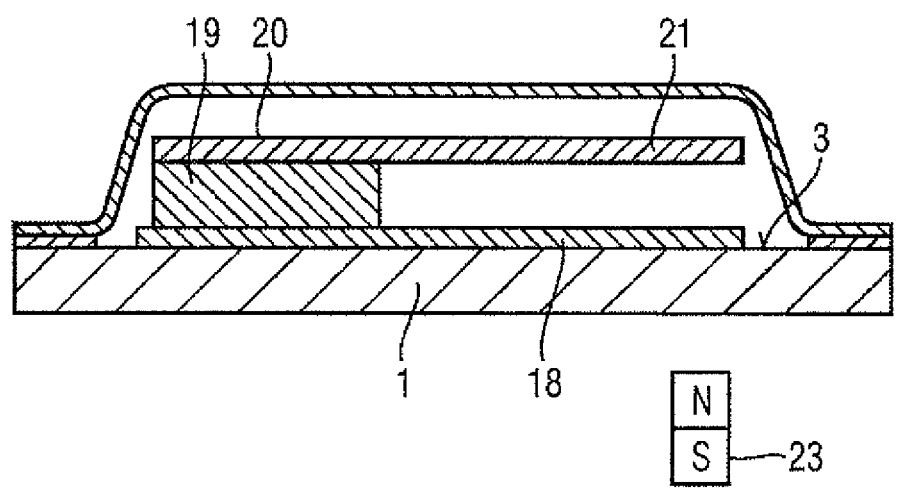
FIG. 4 a section along the line IV-IV of the tank sensor in FIG. 3.

The magnetic position sensor illustrated in FIGS. 3 and 4 is illustrated in the form of an arcuate potentiometer.

In this context, the carrier element 1 bears a resistance network in the form of a track-shaped resistance layer 15 that extends between electrical terminals 16 and 17.

A plurality of contact faces 18 which extend approximately radially from the resistance layer 15 and are electrically connected thereto are arranged spaced apart from one another on the carrier element 1.

A spacer layer 19, on which a soft magnetic, single-piece, comb-like bending bar structure 20 is arranged on the resistance layer 15, approximately congruent therewith.

The bending bar structure 20 includes freely moving bending bars 21, which are supported on one side in the region of the resistance layer 15, and form contact elements which are coated with gold.

The spacer layer 19 keeps the freely moving ends of the bending bar structure 20 at a defined distance from the contact faces 18, wherein the freely moving ends of the bending 1 bars 21 are arranged in an overlapping with the contact faces 18.

The electrically conductive bending bar structure 20 is connected to an external electrical terminal 22.

The resistance layer 15 is electrically connected via the terminals 16 and 17 to the earth and operating voltage.

A signal voltage of the position sensor can be tapped via the electrical terminal 22.

The signal voltage can be varied in a range from 0 V to the operating voltage, and it represents the position of a permanent magnet 23 which can be moved, as a function of a float of a fill level sensor in the tank of a vehicle.

The permanent magnet 23 can move along the bending bar structure 20 on the side of the carrier element 1 facing away from the side bearing the contact faces 18, and said permanent magnet 23 attracts in each case the bending bar 21, lying opposite it, onto a contact face 18.

As a result, an electrical connection to the corresponding position of the resistance layer 15 is generated in accordance with the position of the permanent magnet 23, and a signal voltage which corresponds to this position is tapped and fed to a display unit (not illustrated).

The contact faces which are arranged on the carrier element 1, the resistance layer and the spacer layer are covered by a housing arranged on the carrier element 1.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A tank sensor circuit board for a fill level sensor in a vehicle tank, comprising:
   a carrier element;
   a plurality of contact faces comprising silver arranged on the carrier element, the plural contact faces applied using thick film technology, each of the plural contact faces comprising:
      at least one of:
         a silver layer which is applied to a first surface of the carrier element, and
         a silver-containing layer applied to the first surface of the carrier element, and
      a top layer comprising separate layers of nickel, palladium, and gold, the top layer configured to at least partially cover the at least one of the silver layer and the silver-containing layer,
   wherein the at least one of the silver layer and the silver-containing layer is covered by:
      a first palladium layer,
      a nickel layer covering the first palladium layer, and
      a gold layer covering the nickel layer.

2. The tank sensor circuit board as claimed in claim 1, wherein the nickel layer is covered by a second palladium layer configured to support the gold layer.

3. The tank sensor circuit board as claimed in claim 2, wherein the second palladium layer has a thickness between about 0.1 μm to about 0.7 μm.

4. The tank sensor circuit board as claimed in claim 1, wherein a thickness of the at least one of the silver layer and the silver-containing layer is a multiple of a thickness of the top layer.

5. The tank sensor circuit board as claimed in claim 4, wherein the thickness of the at least one of the silver layer and the silver-containing layer is between about 20 to 40 times the thickness of the top layer.

6. The tank sensor circuit board as claimed in claim 4, wherein the thickness of the at least one of the silver layer and the silver-containing layer is between about 25 to 35 times the thickness of the top layer.

7. The tank sensor circuit board as claimed in claim 1, wherein the at least one of the silver layer and the silver-containing layer has a thickness between about 10 μm to about 200 μm.

8. The tank sensor circuit board as claimed in claim 1, wherein the first palladium layer has a thickness between about 0.001 μm to about 0.02 μm.

9. The tank sensor circuit board as claimed in claim 1, wherein the nickel layer has a thickness between about 3 μm to about 7 μm.

10. The tank sensor circuit board as claimed in claim 1, wherein the gold layer has a thickness between about 0.05 μm to about 0.14 μm.

11. The tank sensor circuit board as claimed in claim 1, wherein the carrier element comprises ceramic.

12. The tank sensor circuit board as claimed in claim 1, wherein a plurality of second contact faces are applied to a second surface of the carrier element opposite the first surface of the carrier element.

13. The tank sensor circuit board as claimed in claim 12, wherein at least one of the plural first and the plural second contact faces are electrically connected.

14. The tank sensor circuit board as claimed in claim 13, wherein the first and second contact faces are electrically connected by at least one via arranged in the carrier element.

15. The tank sensor circuit board as claimed in claim 14, wherein the at least one via comprises a through-opening that projects out of the carrier element, which is closed off in a gastight fashion and is one of metalized on its wall and completely filled with a metal filling.

16. The tank sensor circuit board as claimed in claim 15, wherein the one of the metallization and the metal filling comprises a same material as the contact faces.

17. The tank sensor circuit board as claimed in claim 1, wherein a region of the at least one of the silver layer and the silver-containing layer not covered by the top layer is covered by a protective layer.

18. The tank sensor circuit board as claimed in claim 17, wherein the protective layer is a glass layer.

19. The tank sensor circuit board as claimed in claim 1, further comprising at least one resistance layer, wherein the at least one resistance layer is applied to the carrier element adjacent to the contact faces using thick film technology.

20. The tank sensor circuit board as claimed in claim 19, wherein the at least one resistance layer is covered by the protective layer.

21. The tank sensor circuit board as claimed in claim 1, further comprising a pivotable slide element that pivots as a function of a filling level of the vehicle tank and moves while resting on the top layer forming a slider path of the contact faces.

22. The tank sensor circuit board as claimed in claim 21, wherein one or more contact elements form a contact track that is deflectable as a function of the fill level of the vehicle tank to bear on top layers of the contact faces.

23. The tank sensor circuit board as claimed in one of claim 22, wherein at least one of the slide element and the contact elements are at least partially composed of gold.

* * * * *